United States Patent
Lai et al.

(10) Patent No.: US 7,208,752 B2
(45) Date of Patent: Apr. 24, 2007

(54) STRUCTURE AND MANUFACTURING OF GALLIUM NITRIDE LIGHT EMITTING DIODE

(75) Inventors: Mu-Jen Lai, Chungli (TW);
Schang-Jing Hon, Pa Te (TW);
Hsueh-Feng Sun, Ping Cheng (TW);
Shih-Ming Yang, Ping Cheng (TW)

(73) Assignee: Supernova Optoelectronics Corporation, Taoyuan County (TW)

( * ) Notice: Subject to any disclaimer, the term of this patent is extended or adjusted under 35 U.S.C. 154(b) by 214 days.

(21) Appl. No.: 10/840,267

(22) Filed: May 7, 2004

(65) Prior Publication Data

US 2005/0191179 A1    Sep. 1, 2005

(30) Foreign Application Priority Data

Feb. 27, 2004    (TW)    ................... 93105169

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .............. 257/13; 257/79; 257/85; 257/90; 257/94; 257/96; 257/97; 257/99; 257/101; 257/102; 257/103; 257/201; 257/918

(58) Field of Classification Search ............ 257/13, 257/79, 85, 90, 94, 103, 201, 96, 97, 99, 257/101–102, 918
See application file for complete search history.

(56) References Cited

U.S. PATENT DOCUMENTS

| | | | | |
|---|---|---|---|---|
| 5,932,896 A * | 8/1999 | Sugiura et al. | ................ | 257/94 |
| 5,990,495 A * | 11/1999 | Ohba | ........................... | 257/94 |
| 6,078,064 A * | 6/2000 | Ming-Jiunn et al. | ........ | 257/103 |
| 6,239,490 B1* | 5/2001 | Yamada et al. | ............. | 257/745 |
| 6,281,524 B1* | 8/2001 | Yamamoto et al. | ........... | 257/99 |
| 6,867,426 B2* | 3/2005 | Hsieh et al. | ................... | 257/12 |
| 6,936,860 B2* | 8/2005 | Sung et al. | .................... | 257/99 |
| 7,071,015 B2* | 7/2006 | Shakuda | ...................... | 438/46 |
| 2002/0167019 A1* | 11/2002 | Nakamura et al. | .......... | 257/103 |
| 2003/0062529 A1* | 4/2003 | Kato et al. | .................... | 257/79 |
| 2004/0232439 A1* | 11/2004 | Gibb et al. | ................. | 257/103 |
| 2005/0035354 A1* | 2/2005 | Lin et al. | ...................... | 257/79 |
| 2005/0253151 A1* | 11/2005 | Sakai et al. | ................... | 257/79 |

* cited by examiner

*Primary Examiner*—Ida M. Soward
(74) *Attorney, Agent, or Firm*—Rosenberg, Klein & Lee

(57) ABSTRACT

A structure of a gallium nitride light emitting diode has a transparent conductive window layer including a diffusion barrier layer, an ohmic contact layer, and a window layer. By using the added domain contact layer, the diffusion barrier layer and the P-type semiconductor layer of the light emitting diode are put into ohmic contact. And then, the rising of the contact resistivity is barred by applying the diffusion barrier layer to block the diffusion of the window layer from the contact with the domain contact layer so as to lower down the operating voltage and advance the transparency.

25 Claims, 6 Drawing Sheets

STRUCTURE AND MANUFACTURING OF GALLIUM NITRIDE LIGHT EMITTING DIODE

BACKGROUND OF THE INVENTION

1. Field of the Invention

The present invention relates to a structure and manufacturing method of gallium nitride (GaN)-based light emitting component, especially the structure and manufacturing method of a kind of light emitting diode. The light emitting diode comprises a transparent conductive window layer comprising a domain contact layer, a diffusion barrier layer, and a window layer.

2. Description of the Related Art

In the conventional art, the formed gallium nitride (GaN)-based light emitting diode by using the sapphire substrate as shown in FIG. 1, therein, includes a gallium nitride buffer layer 2, a N-type gallium nitride ohmic contact layer 3, an indium gallium nitride light emitting layer 4, a P-typer aluminum gallium nitride cladding layer 5, and a P-type gallium nitride ohmic contact layer 6, subsequently crystallizing on a sapphire substrate 1, and, at last, with a P-type transparent metallic conductive layer 7 formed on the P-type GaN ohmic contact layer 6, an anode electrode bonding pad 8 on the transparent metallic conductive layer 7, and a cathode electrode bonding pad 9 on the N-type GaN contact layer 3. Because of the population of the specific refraction of the crystalline structure of the GaN multi-layer (n=2.4), the sapphire layer (n=1.77), and the cladding resin material in packing (n=1.5), there is only 25% of the light coming from the light emitting layer that that can be emitted at once without being refracted by the interface; whereas, the left 75% of the light is strained by the light inductive structure configured by the sapphire substrate and the cladding resin used in packing, thus prompting the probability of re-absorbing of the light and causing the inefficiency of usage. Therefore, the extraction mechanism of the light emitting diode structure is subject to the absorption of the transparent metallic conductive layer and the re-absorption of the internal structure of the crystal.

In addition, the conductivity of the P-type GaN ohmic contact layer is very poor. Generally, the electric resistivity locates at 1~2 Ωcm, and the thickness is around 0.1~0.5 μm. In other word, the current would easily be contained under the P-type metal electrode 8; therein the cross-sectional distance of distribution is around 1 μm. Thus, to spread the current efficiently, first of all, the transparent metal conductive layer 7 must be formed on the P-type GaN ohmic contact layer 6 and be scattered on the whole luminous area, and to advance the transparency, the transparent metal conductive layer 7 must be very thin. Generally, the transparent metal conductive layer 7 is formed of the Ni/Au with the thickness between 50~500 Å.

According to the conventional art, the study about the transparent metal conductive layer formed of the Ni/Au, to decrease the operating voltage of the light emitting diode, it is necessary to lower down the contact resistivity of metal conductive layer and the P-type GaN ohmic contact layer to $10^{-4}$ Ωcm². And to increase the efficiency of the external quantum, it ought to be good that the transparency of the metal conductive layer must be higher than 80% with the visible wavelength of light between 400 nm~700 nm. As the disclosure on the P. 1275 of the Applied Physic letters vol. 74(1999), the sample was placed in the oxidization environment to be annealed so as to facilitate the constituting of the middle layer of NiO semiconductor layer to lower down the contact resistivity and advance the transparency. Additionally, according to the disclosure of the study on p. 1741 of Solid-state Electronic 47(2003), to advance the transparency efficiently, it is better with the Ni and Au as thin as available in thickness, whereas, to lower down the contact resistivity, it is better with the Au as thick as possible. Hence, there are still the above-mentioned constraints to utilize the Ni/Au as transparent metal conductive layer of GaN-based light emitting diode.

Furthermore, the Taiwan patent No. 461126 shows a kind of structure of GaN-based light emitting diode as exhibited in FIG. 2, wherein the light emitting diode 10 includes a substrate 110', a n-GaN 120', a n-AlGaN 130', an u-InGaN 140', a p-AlGaN 150', a p-GaN 160', a high carrier concentration layer 170', and a transparent conductive layer 180'.

The transparent conductive layer 180' is connected and mixed with p-GaN 160' by high heart treatment, which is not easily to form a good ohmic contact, thus without the efficient plunging operating voltage of the light emitting diode. Besides, an additional layer 170' such as Ni/Au or Ni/Cr metal can be put between the transparent conductive layer 180' and the p-GaN 160' so as to lower down the operating voltage efficiently. However, according to the personal study, while applying Ni/Au on the structure of the transparent conductive layer, specially on the Indium Tin Oxide, the Au—In mixer with high resistance formed on the interface between the Ni/Au and the Indium Tin Oxide would contribute to the inefficiency of lowering down the operating voltage of the component and the poor transparency in whole because of the easily diffusing of Indium from the Indium Tin Oxide transparent conductive layer in the manufacturing process.

In addition, the U.S. Pat. No. 6,420,736 also disclosed a kind of window layer structure of GaN-based light emitting diode as shown in FIG. 3, wherein, the light emitting diode includes a sapphire substrate 210', a buffer layer 220', a n-GaN layer 230', a n-cladding layer 240', an active layer 250', a p-cladding layer 260', a window layer 270' and 280', a NiOx/Au layer 290', and a transparent conductive layer 300'. Therein, the NiOx/Au layer was used to form the ohmic contact with the p-cladding layer 260', and then the transparent conductive layer 300' was utilized as current spreading and transparent layer. According to the personal study, while using the NiOx/Au as ohmic contact layer, it is still inevitable that the Au—In mixer with high resistance would be formed in the process of manufacturing, so the operating voltage of the components can not be lowered down efficiently, and the transparency in whole would fall easily.

Therefore, to propose the solution of the novel GaN-based light emitting diode structure and manufacturing mehtod, always the expectation and concern of the inventor, to the above-mentioned problem not only can improve the failure of lowering down the operating voltage in the conventional light emitting diode, but also advance the whole transparency. Because of engagement in the personal study, invention, and the sales experience for many years, the intention of improving has been in embryo, and finally the structure and improved manufacturing of kind of GaN-based light emitting diode to the above-mentioned problem has been figured out.

SUMMARY OF THE INVENTION

It is an object of the present invention to provide a structure and manufacturing method of GaN-based light emitting diode, in which, the transparent conductive window layer comprises a domain contact layer, a diffusion barrier layer, and a window layer. Therein, the ohmic contact is configured via the domain contact layer, the diffusion barrier layer, and a P-type semiconductor layer. As the window layer and the domain contact layer are blocked by the diffusion barrier layer, it not only can lower down the operating voltage of the light emitting diode, but also advance the emitting efficiency.

It is another object of the present invention to provide a structure and manufacturing method of GaN-based light emitting diode. It not only can decrease the contact resistivity of the N-type electrode and a N-type semiconductor via the heat treatment while forming a N-type electrode, but also anneal the window layer so as to advance the transparency of the window layer and prompt the contact resistivity of said window layer and said diffusion barrier layer.

In order to achieve the afore-mentioned purposes and advantages, this invention is to disclose the structure and manufacturing method of a kind of GaN-based light emitting diode, in which, the transparent conductive window layer comprises a domain contact layer, a diffusion barrier layer, and a window layer. Therein, the ohmic contact is configured via the added domain contact layer between the diffusion barrier layer and a P-type semiconductor layer. Moreover, as the Au—In mixer caused by the diffusion, which then contributes to the rising of contact resistivity, between the window layer and the domain contact layer is blocked by the diffusion barrier layer, the operating voltage of the light emitting diode is lowered down and the transparency is advanced.

DETAILED DESCRIPTION OF THE PREFERRED EMBODIMENT

Figure 1:
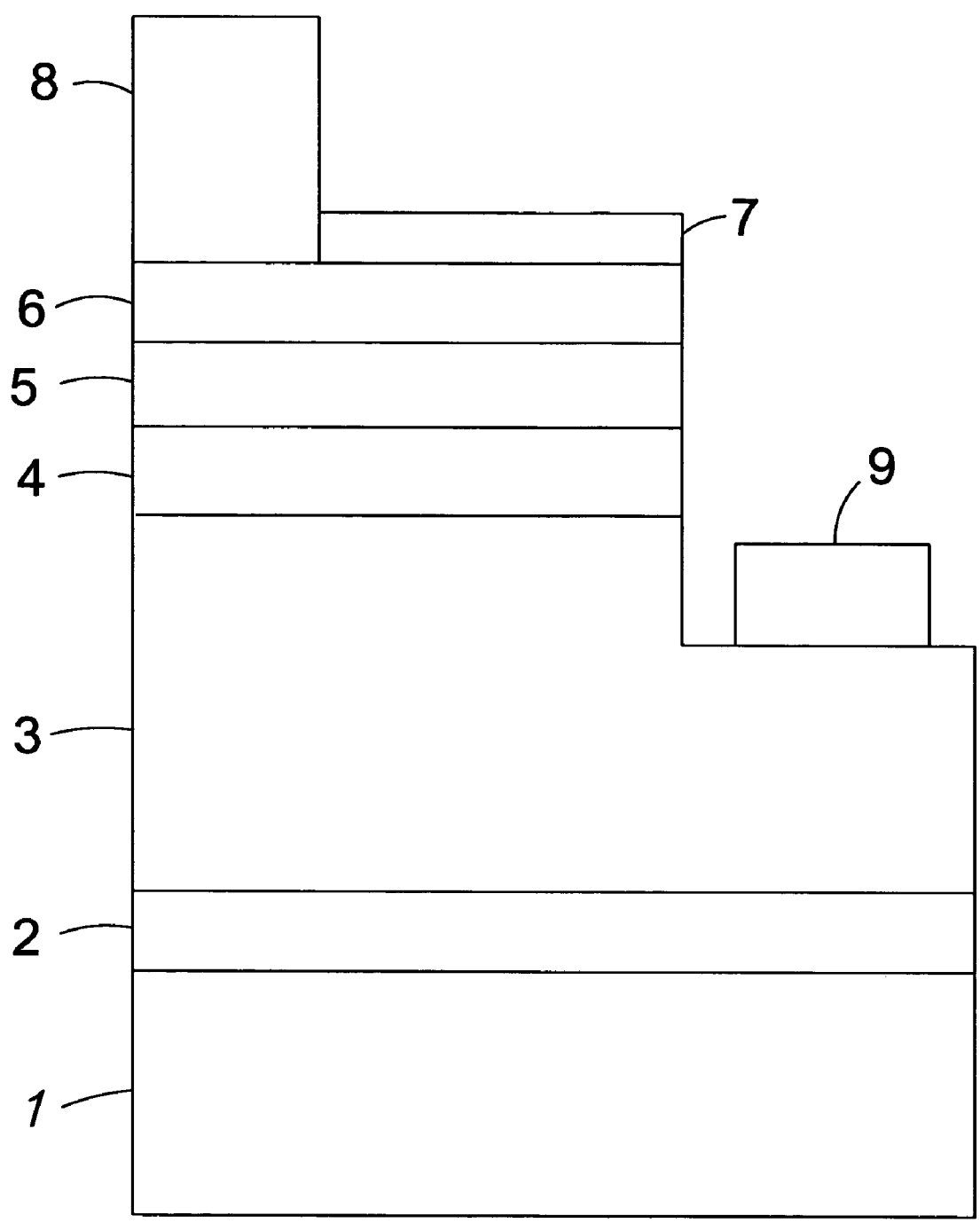
FIG. 1 is the depiction of the conventional light emitting diode structure.
Figure 2:
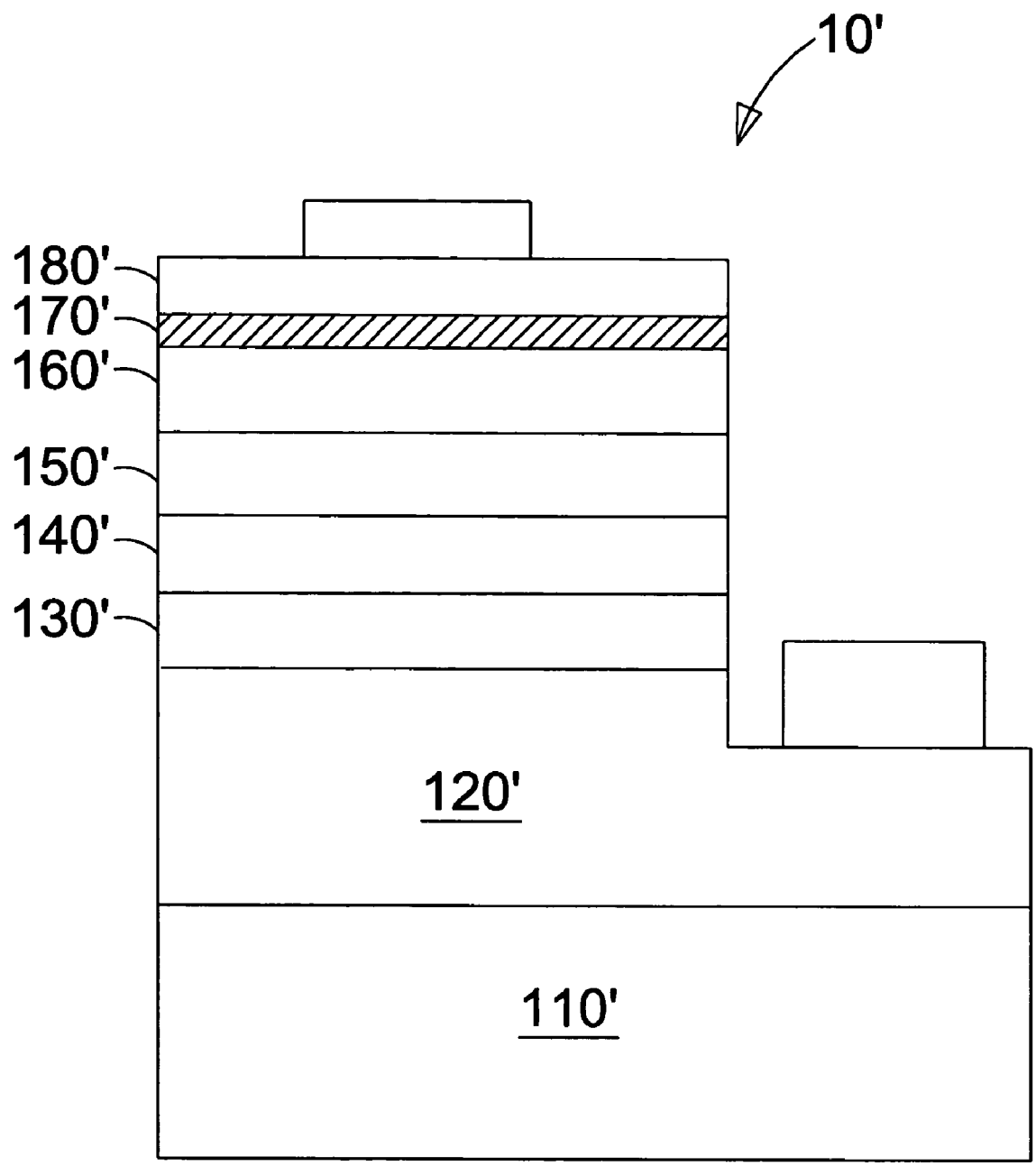
FIG. 2 is the depiction of the conventional light emitting diode structure.
Figure 3:
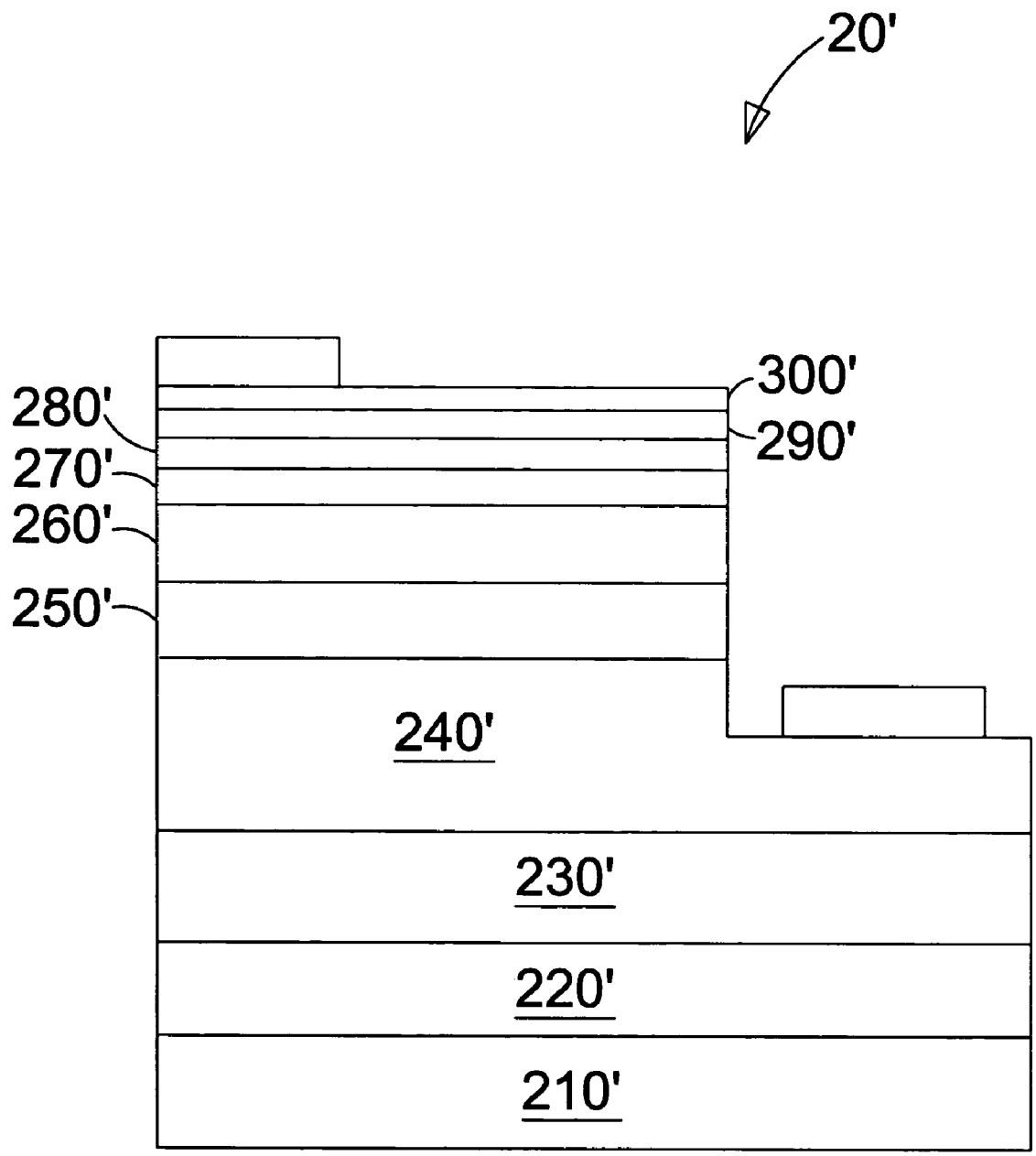
FIG. 3 is the depiction of the conventional light emitting diode structure.

To have a further understanding about the features of the structure and the achieved effects, of the present invention, the preferred embodiment and detailed description are unfolded as following.

This invention is to improve the failures of the transparent conductive layer (TCL) of the GaN-based light emitting diode in the conventional art such as the failure to decrease the operating voltage and the failure of plunging transparency shown in the Taiwan patent certificate No. 134977, Taiwan claims No. 461126, 493287, 546859, and 488088, and the U.S. Pat. Nos. 6,420,736 and 6,319,808.

The TCL as shown in all the above-mentioned arts, is made of indium tin oxide (ITO) because of its high transparency and low resistance. However, it is not easy to form the ohmic contact between the ITO, and the P-type semiconductor layer of the light emitting diode. Therefore, an ohmic metal contact layer is necessary between them, otherwise, the changed structure of light emitting layer such as utilizing the strained layer superlattices (SLS), N+/p tunneling junction, or the digital tunneling layer, Wherein, the strained layer superlattices is made of the GaN based III-V compounds, and the digital tunneling layer is formed alternately of two stacked materials (i.e., $Al_xIn_yGa_{1-x-y}N_zP_{1-z}$/$Al_pIn_qGa_{1-p-q}N_rP_{1-r}$) with the gradually increasing/decreasing thickness, in which $0 \leq x, y, z, p, q, r \leq 1$.

As the indium tin oxide (ITO) is not only a kind of high energy bandgap, locating between 2.9~3.8 electron voltage, with the transmittance as high as 95% in visible spectrum region, but also an electron-transport N-type high conductive material with the carrier concentration of nearly $10^{20}$~$10^{21}$ cm$^{-3}$, and mobility is nearly 10~50 cm$^2$/V sec. Furthermore, the refraction index of indium tin oxide (ITO) is swinging at 1.7~2.2. According to Snell's law and the anti-reflection principle, because of population of the specific refractions of the multi-layer GaN crystalline structure (n=2.4) and the resin cladding material in packing (n=1.5), the added middle dielectric with specific refraction of n~1.9 can decrease the reflection of light after packing and advance the efficiency of the light extracting. In the present invention the ITO is used as the window layer of light emitting diode.

The concentration of this invention is focused on a transparent conductive layer, and following is the description. This invention discloses that it can not form the ohmic contact with the P-type semiconductor layer by only using the diffusion barrier layer such as NiOx compound, whereas, the ohmic contact can be configured by the diffusion barrier layer and the window layer such as Indium oxide, Tin oxide, Indium molybdenum oxide, or Indium Tin oxide. Therefore, in this invention, the domain contact layer such as the metal film layer is put between the P-type semiconductor layer and the diffusion barrier layer, to achieve the ohmic contact under the mixing in the oxidization environment. Wherein, the mechanism is to formulate the Domain Match Epitaxy between the domain contact layer and the P-type semiconductor layer. In this invention, the diffusion barrier layer is used to block the diffusion of In of the window layer, which would form the interface layer with the domain contact layer and then cause the rising contact resistivity.

Figure 4:
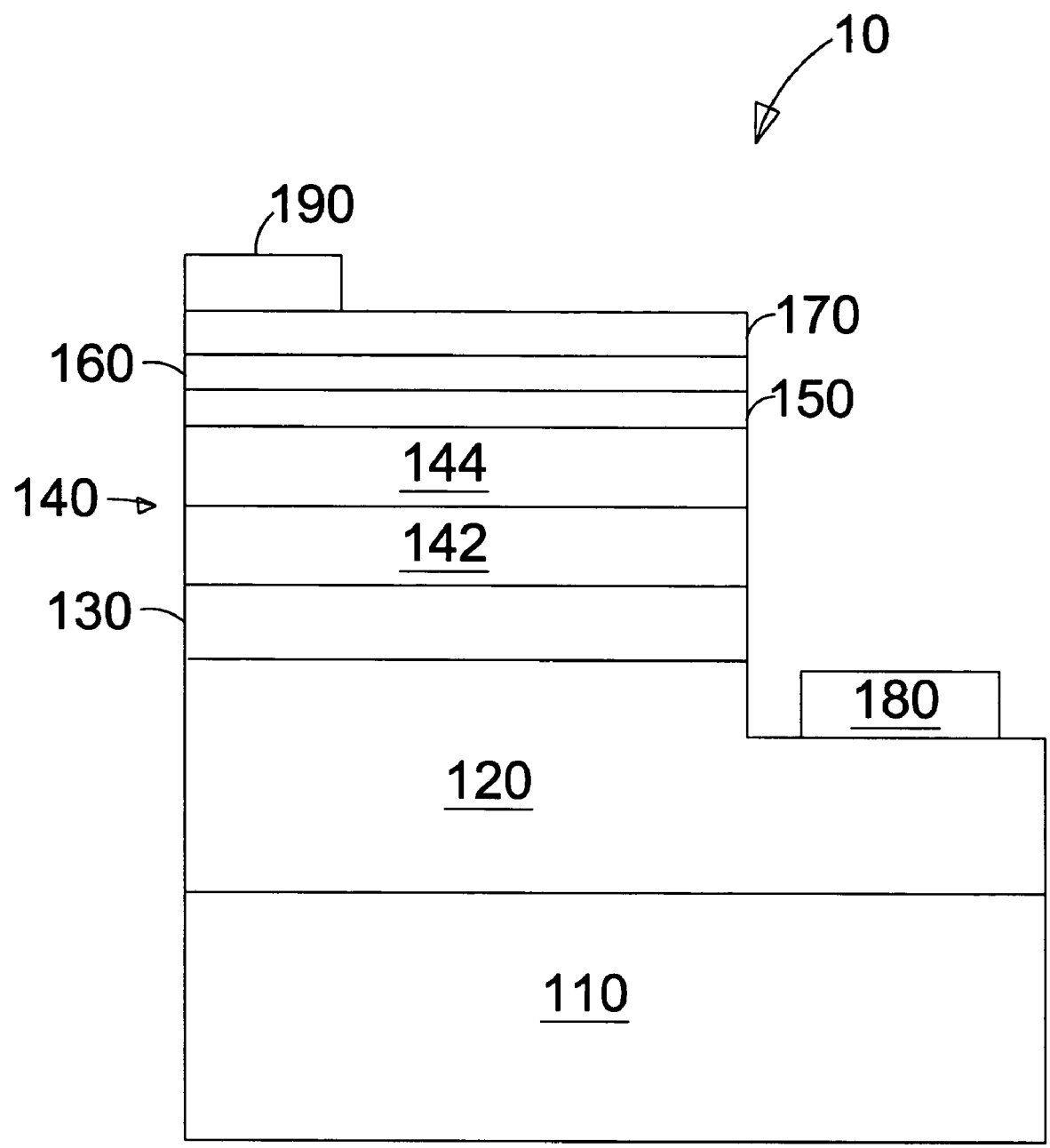
FIG. 4 is the preferred embodiment of the GaN-based light emitting diode structure of this invention.

FIG. 4 is a preferred embodiment of GaN-based light emitting diode configuration of this invention. As the exhibition of the figure, the main structure of the GaN-based light emitting diode 10 of this invention comprises a substrate 110, a first conductive semiconductor layer 120, a light emitting layer 130, a second conductive semiconductor layer 140, a domain contact layer 150, a diffusion barrier layer 160, a window layer 170, a first electrode 180, and a second electrode 190.

Wherein, the first conductive semiconductor layer 120 is formed on the substrate 110, the light emitting layer 130 is on the first conductive semiconductor layer 120, and the second conductive semiconductor layer 140 is on the light emitting layer 130. The second conductive semiconductor layer 140 comprises a second conductive semiconductor cladding layer 142 formed on the light emitting layer 130, and with a second conductive semiconductor ohmic contact layer 144 formed thereon. In addition, the domain contact layer 150, with a diffusion barrier layer 160 formed thereon, is formed on the second conductive semiconductor layer 140. The window layer 170 is formed on the diffusion barrier layer 160, the first electrode 180 is formed on the first conductive semiconductor layer 120, and the second electrode 190 is formed on the window layer 170. The said diffusion barrier layer 160 is used to block the diffusion, which causes the rising contact resistivity, between the window layer 170 and the domain contact layer 150. As shown in FIG. 4, which is the preferred embodiment of the GaN-based light emitting diode structure of this invention, therein, the second diffusion barrier layer 200 is included in the middle of the second conductive semiconductor layer 140 and the domain contact layer 150. The substrate 110 can be a transparent substrate selected from the group consisting of sapphire, ZnO, LiGaO, LiAlO, and spinel or SiC, GaAs, and Si. The first conductive semiconductor layer 120 formed of GaN, AlInGaN, or InGaN, and the second conductive semiconductor layer 140 is made of GaN, AlInGaN, or InGaN. The light emitting layer 130 is made of a nitride semiconductor comprsing with indium, and the domain contact layer 150 is a gold layer. In addition, the diffusion barrier layer 160 and the second diffusion barrier layer 200 are a NiOx compound layer, and the window layer 170 is a transparent conductive layer formed of Indium Oxide, Tin Oxide, or Indium Tin Oxide.

Figure 5:
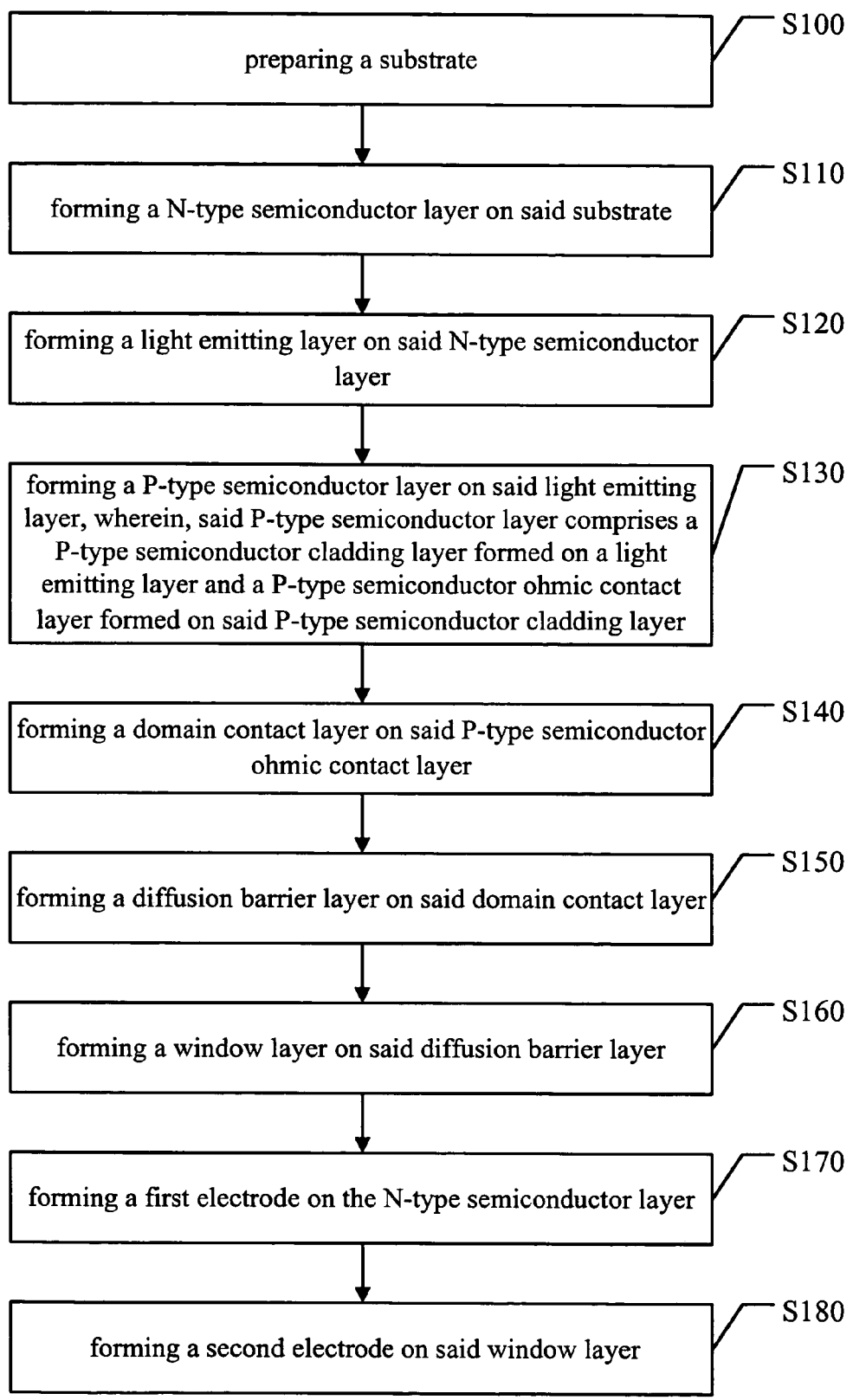
FIG. 5 is the preferred embodiment of the manufacturing procedure of the GaN-based light emitting diode of this invention.

As shown in FIG. 5, which is the preferred embodiment of the manufacturing procedure of the GaN-based light emitting diode of this invention, comprises the steps of:

Step S100: preparing a substrate.

Step S110: forming a N-type semiconductor layer on said substrate.

Step S120: forming a light emitting layer on said N-type semiconductor layer.

Step S130: forming a P-type semiconductor layer on said light emitting layer, wherein, said P-type semiconductor layer comprises a P-type semiconductor cladding layer formed on a light emitting layer and a P-type semiconductor ohmic contact layer formed on said P-type semiconductor cladding layer.

Step S140: forming a domain contact layer on said P-type semiconductor ohmic contact layer.

Step S150: forming a diffusion barrier layer on said domain contact layer.

Step S160: forming a window layer on said diffusion barrier layer.

Step S170: forming a first electrode on the N-type semiconductor layer, and

Step S180: forming a second electrode on said window layer.

Wherein, the step S140 of forming a domain contact layer on the P-type semiconductor ohmic contact layer can be substituted by the following step:

Step S142: forming a second diffusion barrier layer on said P-type semiconductor ohmic contact layer, and Step S142: forming a domain contact layer on said second diffusion barrier layer.

EXAMPLE 1

Preparing a substrate, the low temperature buffer layer is crystallized on the its surface under the low temperature at first, and then with a high temperature buffer layer formed thereon under the high temperature. The afore-mentioned low and high temperature buffer layers are made of the GaN-based compound semiconductor which is generally $Al_xGa_{1-x}N(0 \leq x \leq 1)$.

Upon the forming of low temperature with the thickness of around 200~300 Å, and the high temperature buffer layer with the thickness of around 0.7 μm, the N—GaN ohmic contact layer with the electron concentration around 3~5e+18 $cm^{-3}$ crystallized on the high temperature buffer layer subsequently. Then, the light emitting layer consisting of undoped InGaN is formed. After the crystallizing of the light emitting layer, the cladding layer 4 comprising the P—AlGaN with the hole concentration around 3e+17~5e+17 $cm^{-3}$ and ohmic contact layer consisting of the P—GaN with the hole concentration around 3e+17~1e+18 $cm^{-3}$. After the crystallizing of the whole light emitting component, part of the N—GaN ohmic contact layer surface, light emitting layer, P—AlGaN cladding layer, and P—GaN ohmic contact layer are eliminated by the dry etching to expose the N—GaN ohmic contact layer.

Subsequently, as shown in FIG. 4, the steps of forming the ohmic contact layer, the diffusion barrier layer, the window layer, and the anode and cathode electrode—the focus of this invention—are unfolded as following.

(1) Cleaning the surface of the P—GaN ohmic contact layer and the N—GaN ohmic contact layer with BOE and $(NH4)_2S_x$, respectively for ten minutes of each.

(2) Then fabricating a metallic film layer (epitaxial contact monolayer) of gold, the domain contact layer, with the thickness around 5~20 Å on the P—GaN ohmic contact layer by using the E-beam evaporation and the first metal layer of nickel, the diffusion barrier layer, with the thickness around 25~50 Å. Following, by using the rapid thermal annealing or furnace annealing to alloy caused they are domain match of GaN/Au/NiOx under the oxidization environment for about 5~20 minutes so as to decrease the contact resistivity with P—GaN ohmic contact layer.

(3) Subsequently, by using the wet etching, the metallic film uncovering on the P—GaN ohmic contact layer is removed.

(4) Forming a ITO transparent conductive layer-the window layer-with the thickness about 500~4000 Å on the NiOx (nickel oxide) metal oxidize film layer by E-beam evaporation or sputtering, and by using the wet etching to remove the ITO that uncovering on the NiOx (nickel oxide) metal oxidize film layer.

(5) Forming Ti/Al on the N—GaN ohmic contact layer, and alloy it by the rapid thermal annealing or furnace under the environment with nitride at the temperature of 450~600° C. for about 5~30 minutes to decrease the contact resistivity of Ti/Al and N—GaN ohmic contact layer 20 and, at the same time, the ITO also be alloyed, so as to advance the transparency of ITO and the contact resistivity of ITO and NiOx (nickel oxide) metal oxidize film layer.

(6) Subsequently, forming a Ti/Au anode electrode bonding pad and cathode bonding pad on the surface of the P—GaN ohmic contact layer and the N—GaN ohmic contact layer.

EXAMPLE 2

Preparing a substrate, and have a low temperature buffer layer crystallized on the surface of the substrate, and then with the high temperature buffer layer crystallized thereon. The materials of the afore-mentioned low and high temperature buffer layers are made of the GaN-based compound semiconductor which generally is $Al_xGa_{1-x}N(0 \leq x \leq 1)$.

Upon forming a low temperature buffer layer with thickness about 200~300 Å and a high temperature buffer layer with thickness about 0.7 μm, crystallizing a N—GaN ohmic contact layer with the electron concentration about 3~5e+18 $cm^{-3}$ and grown thickness of around 2~5 μm on the high temperature buffer layer. And then forming a light emitting layer made of InGaN without doping impurity. Having crystallized the light emitting layer, forming a cladding layer made of P—AlGaN and a transition layer made of P—GaN with the hole concentration about 3e+17~5e+17 cm$^{-3}$ and an ohmic contact layer with the hole concentration about 5e+17~2e+18 cm$^{-3}$ made of P—InGaN. After finished all the crystallizing of the whole light emitting component, eliminate part of the surface of the N—GaN ohmic contact layer, light emitting layer, P—AlGaN cladding layer, P—GaN transition layer and P—InGaN ohmic contact layer by dry etching to expose the surface of the N—GaN ohmic contact layer.

Figure 4A:
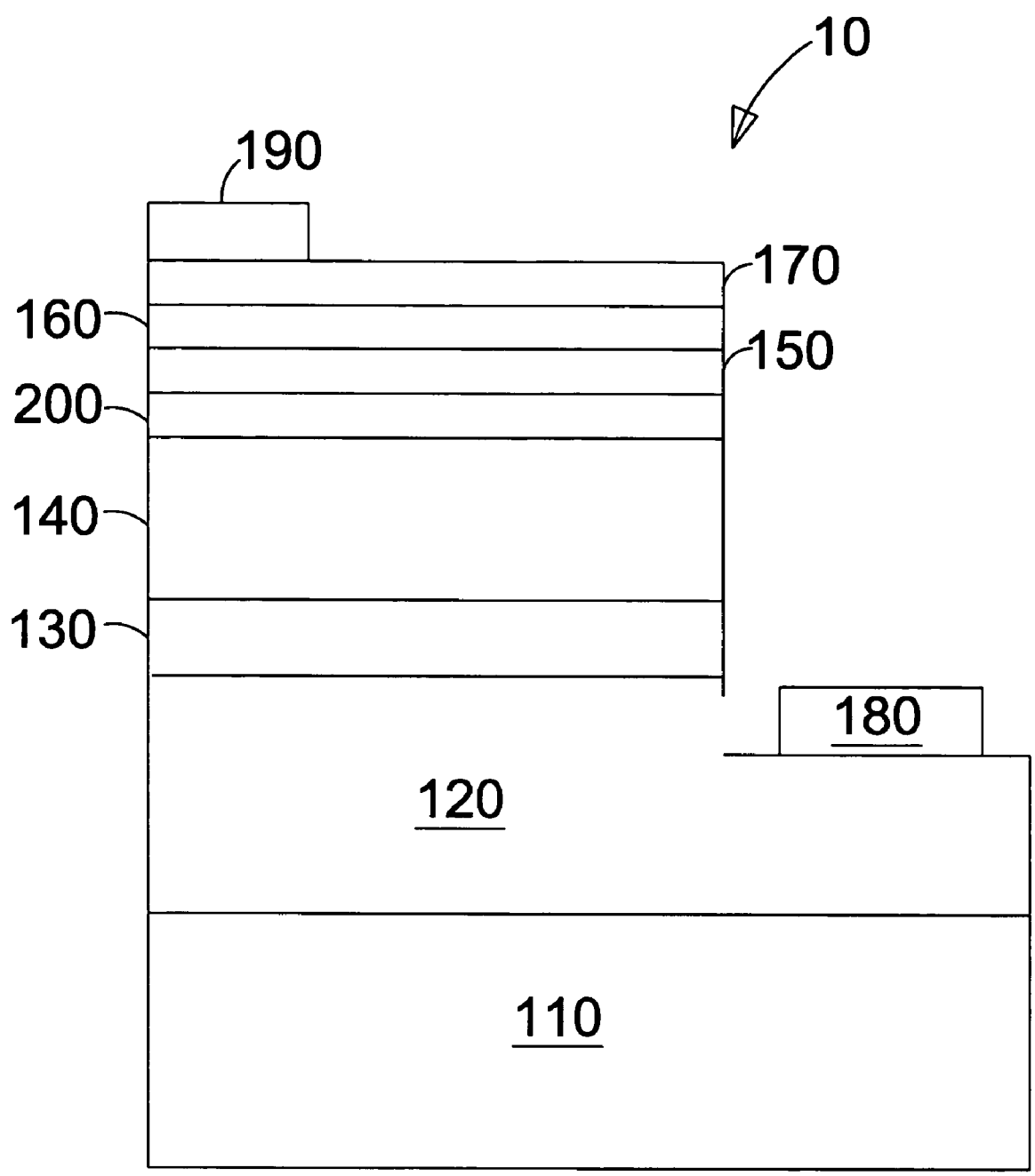
FIG. 4A is another preferred embodiment of the GaN-based light emitting diode structure of this invention.

And then, make the domain contact layer, diffusion barrier layer, window layer, and the anode and cathode electrodes, the concentrations of this invention, via the following steps. See FIG. 4A.

(1) Using the BOE and (NH4)$_2$S$_x$ respectively to clean the surface of P—InGaN ohmic contact layer and N—GaN ohmic contact layer for about 10 minutes for each.

(2) Forming a 5~20 Å thick nickel metallic film layer-the diffusion barrier layer (also named as the second metal oxide film layer), a domain contact layer of 5~20 Å thick gold metallic film layer, and a diffusion barrier layer of first metal oxide film layer of nickel with thickness of 10~50 Å on the surface on P—InGaN ohmic contact layer. And then, by using the rapid thermal annealing (RTA) or furnace to alloy cause to form NiOx/Au/NiOx under the environment with oxygen at the temperature of 450~600° C. so as to decrease the contact resistivity with the P—InGaN ohmic contact layer.

(3) Subsequently, by using the wet etching, the metallic film uncovering on the P—InGaN ohmic contact layer is removed.

(4) Forming a ITO transparent conductive layer-the window layer-with the thickness about 500~4000 Å on the NiOx (nickel oxide) metal oxidize film layer by E-beam evaporation or sputtering, and by using the wet etching to remove the ITO that uncovering on the NiOx (nickel oxide) metal oxidize film layer.

(5) Forming Ti/Al on the N—GaN ohmic contact layer, and alloy it by the rapid thermal annealing or furnace under the environment with nitride at the temperature of 450~600° C. for about 5~30 minutes to decrease the contact resistivity of Ti/Al and N—GaN ohmic contact layer 20 and, at the same time, the ITO also be alloyed, so as to advance the transparency of ITO and the contact resistivity of ITO and NiOx (nickel oxide) metal oxidize film layer.

(6) Subsequently, forming a Ti/Au anode electrode bonding pad and cathode bonding pad on the surface of the P—GaN ohmic contact layer and the N—GaN ohmic contact layer.

Numerals of Experiment

| A. Transmittance of Contact Layer on P-GaN | | | | | |
|---|---|---|---|---|---|
| Sequence of layers | NiO-Au-ITO | Au-NiO-ITO | NiO-ITO | NiO-Au-NiO-ITO | NiO-Au-ITO |
| Transmittance before alloying (%) | 66.2 | 71.3 | 79.6 | 72.6 | 55.5 |
| Transmittance after alloying (%) | 78.3 | 88.6 | 90.2 | 89.5 | 66.4 |
| Operating voltage (Vf) | 3.8 | 3.4 | 4.1 | 3.2 | 3.9 |

| B. Transmittance of Contact Layer on P-InGaN | | | | | |
|---|---|---|---|---|---|
| Sequence of metallic layers | Ni-Au | Au-Ni | Ni | Ni-Au-Ni | Ni-Au |
| Thickness (angstrom) | 30–10 | 10–30 | 30 | 10–10–20 | 30–30 |
| Transmittance before alloying (%) | 61.7 | 65.7 | 72.8 | 66.9 | 55.6 |
| Transmittance after alloying (%) | 90.5 | 85.4 | 96.7 | 88.5 | 75.3 |

In conclusion, this invention definitely achieves creativity, improvement, and more usability for the users in the industry. This being the case, it should be qualified for the patent applications in the intellectual patent regulation of our country, thus being proposed for the approval of the patent. Looking forward to the kind rendering of the approval at the earliest convenience.

The above-mentioned practice is only a preferred embodiment of this invention, not the specified limit of it. All the parallel changes and revisions of the shape, the structure, the feature, and the spirit evolving from this invention should be included in the field of the claimed patent of this invention.

What is claimed is:

1. A GaN-based light emitting diode structure comprising:
   a substrate;
   a first conductive semiconductor layer formed on said substrate;
   a light emitting layer formed on said first conductive semiconductor layer, said light emitting layer being made of a nitride-based semiconductor with indium;
   a second conductive semiconductor layer formed on said light emitting layer;
   a domain contact layer formed on said second conductive semiconductor layer;
   a diffusion barrier layer formed on said domain contact layer;
   a window layer formed on said diffusion barrier layer;
   a first electrode formed on said first conductive semiconductor layer; and
   a second electrode formed on said window layer;
   wherein said diffusion barrier layer is formed to block said diffusion from said window layer to said domain contact layer to avoid the rising of contact resistivity.

2. The GaN-based light emitting diode structure as claimed in claim 1, wherein said substrate can be made of SiC, GaAs or Si materials.

3. The GaN-based light emitting diode structure as claimed in claim 1, wherein said first conductive semiconductor layer is made of GaN, AlInGaN, or InGaN.

4. The GaN-based light emitting diode structure as claimed in claim 1, wherein said second conductive semiconductor layer is made of GaN, AlInGaN, or InGaN.

5. The GaN-based light emitting diode structure as claimed in claim 1, wherein said domain contact layer is a gold layer.

6. The GaN-based light emitting diode structure as claimed in claim 1, wherein said substrate is a transparent substrate.

7. The GaN-based light emitting diode structure as claimed in claim 6, wherein said substrate can be made of sapphire, ZnO, LiGaO, LiAlO, or spinel.

8. The GaN-based light emitting diode structure as claimed in claim 1, wherein said window layer is transparent conductive layer.

9. The GaN-based light emitting diode structure as claimed in claim 8, wherein said transparent conductive layer is made of Indium oxide, Tin oxide, Indium molybdenum oxide, or Indium Tin oxide.

10. A GaN-based light emitting diode structure comprising:
    a substrate;
    a first conductive semiconductor layer formed on said substrate;
    a light emitting layer formed on said first conductive semiconductor layer;
    a second conductive semiconductor layer formed on said light emitting layer;
    a domain contact layer formed on said second conductive semiconductor layer;
    a diffusion barrier layer formed on said domain contact layer, said diffusion barrier layer being made of NiOx;
    a window layer formed on said diffusion barrier layer;
    a first electrode formed on said first conductive semiconductor layer; and
    a second electrode formed on said window layer;
    wherein said diffusion barrier layer is formed to block said diffusion from said window layer to said domain contact layer to avoid the rising of contact resistivity.

11. A GaN-based light emitting diode structure comprising:
    a substrate;
    a first conductive semiconductor layer formed on said substrate;
    a light emitting layer formed on said first conductive semiconductor layer;
    a second conductive semiconductor layer formed on said light emitting layer;
    a domain contact layer formed on said second conductive semiconductor layer;
    a first diffusion barrier layer formed on said domain contact layer;
    a window layer formed on said first diffusion barrier layer;
    a first electrode formed on said first conductive semiconductor layer;
    a second electrode formed on said window layer; and,
    a second diffusion barrier layer interpose between said second conductive semiconductor layer and said domain contact layer;
    wherein said first diffusion barrier layer is formed to block said diffusion from said window layer to said domain contact layer to avoid the rising of contact resistivity.

12. A GaN-based light emitting diode structure comprising:
    a substrate;
    a N-type semiconductor layer formed on said substrate;
    a light emitting diode formed on said N-type semiconductor layer;
    a P-type semiconductor, comprising a P-type semiconductor cladding layer and a P-type semiconductor ohmic contact layer formed on said light emitting layer;
    a metallic film layer formed on said P-type semiconductor ohmic contact layer;
    a first metal oxide film layer formed on said metallic film layer;
    a transparent conductive layer formed on said first metal oxide film layer;
    a first electrode formed on said N-type semiconductor layer; and
    a second electrode formed on said transparent conductive layer.

13. The GaN-based light emitting diode structure as claimed in claim 12, wherein said substrate can be made of SiC, GaAs, or Si materials.

14. The GaN-based light emitting diode structure as claimed in claim 12, wherein said N-type conductive semiconductor layer is made of GaN, AlInGaN or InGaN.

15. The GaN-based light emitting diode structure as claimed in claim 12, wherein said P-type conductive semiconductor is made of GaN, AlInGaN, or InGaN.

16. The GaN-based light emitting diode structure as claimed in claim 12, wherein said light emitting layer is made of the nitride-based semiconductor with indium.

17. The GaN-based light emitting diode structure as claimed in claim 12, wherein said metallic film layer refers to a gold layer.

18. The GaN-based light emitting diode structure as claimed in claim 12, wherein said first metal oxide film layer refers to a NiOx layer.

19. The GaN-based light emitting diode structure as claimed in claim 12, wherein said transparent conductive layer is made of Indium oxide, Tin oxide, Indium molybdenum oxide, or Indium Tin oxide.

20. The GaN-based light emitting diode structure as claimed in claim 12, wherein said metallic film layer is with the thickness of 5~20 Å.

21. The GaN-based light emitting diode structure as claimed in claim 12, wherein said first metal oxide film layer is with the thickness of 25~50 Å.

22. The GaN-based light emitting diode structure as claimed in claim 12, wherein said substrate is a transparent substrate.

23. The GaN-based light emitting diode structure as claimed in claim 22, wherein said substrate can be made of sapphire, ZnO, LiGaN, LiAlN, or spinel.

24. The GaN-based light emitting diode structure as claimed in claim 12, wherein further comprising a second metal oxide layer interposed between said metallic film layer and said P-type semiconductor ohmic contact layer.

25. The GaN-based light emitting diode structure as claimed in claim 24, wherein said second metal oxide layer is made of NiOx.

* * * * *